United States Patent [19]

Hsu et al.

[11] Patent Number: 5,661,055

[45] Date of Patent: Aug. 26, 1997

[54] METHOD OF MAKING NONVOLATILE MEMORY CELL WITH VERTICAL GATE OVERLAP AND ZERO BIRDS' BEAKS

[75] Inventors: James Juen Hsu, Saratoga; Steven W. Longcor, Mountain View; Jih-Chang Lien, San Jose, all of Calif.

[73] Assignee: Advanced Micro Devices, Inc., Sunnyvale, Calif.

[21] Appl. No.: 474,610

[22] Filed: Jun. 7, 1995

Related U.S. Application Data

[62] Division of Ser. No. 469,953, Jun. 6, 1995.

[51] Int. Cl.$^6$ .................................. H01L 21/8247
[52] U.S. Cl. ..................... 438/259; 438/262; 438/453; 438/773
[58] Field of Search ................... 437/43, 69, 70; 148/DIG. 50

[56] References Cited

U.S. PATENT DOCUMENTS

| 4,622,737 | 11/1986 | Ravaglia | 437/43 |
| 4,849,369 | 7/1989 | Jeuch et al. | 437/43 |
| 5,004,701 | 4/1991 | Motokawa | 437/70 |
| 5,100,830 | 3/1992 | Morita | 437/70 |

OTHER PUBLICATIONS

"Physical and Electrical Characterization of a SILO Isolation Structure," Deroux-Dauphin, et al., IEEE Transactions of Electron Devices, vol., ED-32, No. 11, p. 2392, Nov., 1985.

"Electrical Properties for MOS LSI's Fabricated Using Stacked oxide SWAMI Technology," Sawada, et al., IEEE Transactions on Electron Devices, Col. ED-32, No. 11, p. 2243, Nov. 1985.

Primary Examiner—Chandra Chaudhari
Attorney, Agent, or Firm—James H. Phillips; Michael A. Lechter

[57] ABSTRACT

A memory device, such as a flash EEPROM, has zero birds' beaks and vertically overlapping gates to facilitate high cell density in the EEPROM's core. During fabrication, a layer of field oxide is formed over the core. The active regions are exposed by etching through the layer of field oxide to form vertically walled cavities around the active regions. The tunnel oxide, floating gate, interpoly dielectric, and the control gate are formed within each cavity so that the floating gate overlaps the control gate along the vertical walls. As a result, capacitive coupling between the gates is maintained, yet the horizontal dimensions of the cell decrease. Similarly, the absence of birds' beaks facilitates higher cell density in the core.

23 Claims, 5 Drawing Sheets

METHOD OF MAKING NONVOLATILE MEMORY CELL WITH VERTICAL GATE OVERLAP AND ZERO BIRDS' BEAKS

This is a divisional of U.S. patent application Ser. No. 08/469,953, filed on Jun. 6, 1995.

BACKGROUND OF THE INVENTION

1. Field of the Invention

The present invention relates to high density semiconductor devices and to methods for forming and isolating active regions and components of a high density semiconductor device.

2. Description of Related Art

Semiconductor devices typically include multiple individual components formed on or within a substrate. Such devices often comprise high density and low density sections. "High density" refers generally to an area in which elements tend to be repetitious, densely packed with consistent, but small, spacing. "Low density" refers to areas containing differing types of (e.g., non-repetitious) circuitry with greater spacing between elements. For example, referring to FIGS. 1, 2, and 2A, a memory device, such as a flash electrically erasable programmable read only memory (EEPROM) 50 commonly comprises one or more high density core regions 130 and a low density peripheral portion 150 on a single substrate 100. High density core 130 typically comprises at least one M×N array 104 of individually addressable, substantially identical memory cells (FIG. 2). Low density peripheral portion 150 typically includes input/output (I/O) circuitry and circuitry for selectively addressing the individual cells. The selective addressing circuitry typically includes one or more x-decoders and y-decoders, cooperating with the I/O circuitry for connecting the source, gate, and drain of selected addressed cells to predetermined voltages or impedances to effect designated operations on the cell, e.g., programming, reading and erasing, and deriving necessary voltages to effect such operations. Generally, circuitry in peripheral portion 150 is more varied and irregular than circuitry in core 130, and thus less subject to high density placement or formation, and, additionally, tends to handle higher voltage levels, increasing the inter-element isolation requirements of the device.

Referring now to FIGS. 2 and 2A, each cell 190 in core 130 typically comprises: source 210, drain 220, and channel 250 semiconductor regions formed in a substrate 100; and a stacked gate (word line) structure 200. Gate structure 200 suitably comprises: a thin gate dielectric layer 260 (commonly referred to as the "tunnel oxide") formed on the surface of substrate 100 overlying channel 250; a floating gate 230 overlying tunnel oxide 260; an interpoly dielectric 270 overlying floating gate 230; and a control gate 240 overlying interpoly dielectric layer 270. The control gates 240 of the respective cells 190 in a row are formed integral to a common word line (WL) associated with the row. In the completed array, the source 210 of each cell in a column (excepting end cells) is formed in a common region with one of the adjacent cells, e.g., the preceding cell in the column. Likewise, the drain of the cell is formed in a common region with the drain 220 of the other adjacent cell, e.g., next succeeding cell in the column. Additionally, the sources of each cell 190 in a row (and hence pairs of rows) are formed as a common region, facilitating formation of a common source line CS (FIG. 2A). The drain of each cell in a row of cells is connected by a conductive bit line (BL) (FIG. 2A).

Channel 250 selectively conducts current between source 210 and drain 220 in accordance with the electric field developed in channel 250 by gates 230, 240. By appropriately charging (programming) and discharging (erasing) floating gate 230, the threshold voltage $V_T$ of cell 190 (i.e., the voltage $V_G$ that must be applied to control gate 240 to cause conduction between source and drain) may be selectively varied to program cell 190.

When a cell is programmed, electrons are injected through tunnel oxide 260 to floating gate 230. The resulting negative potential on floating gate 230 generally raises the threshold voltage $V_T$ of the cell. To read the cell, a predetermined voltage $V_G$ that is greater than the threshold voltage of an unprogrammed cell, but less than the increased threshold voltage of a programmed cell, is applied to control gate 240. If the cell conducts, it is deemed unprogrammed (a first logic state, e.g. zero), and if it does not conduct it is deemed programmed (a second logic state, e.g. one).

Referring to FIG. 2A, typically, in forming an array 104 of memory cells 190 such as used in a conventional EEPROM 50, a pattern of field oxide regions 300 is initially formed within the core region, as will be discussed. Stacked gate-word line structures 200 (one corresponding to each row) are then formed, followed by further etching and dopant implantation in exposed regions of substrate 100 (in predetermined disposition to stacked gate structures 200) to form the source and drain regions of the respective cells 190.

Electrical isolation between the respective devices of memory device 50 is typically effected using respective field oxide regions. For example, field oxide regions are used to provide isolation between array 104 in core region 130 from the devices of peripheral region 150, as well as between the various columns of cells 190 within core region 130. Field oxide regions are conventionally formed using a mask and selective growth process as will be discussed. In general, within core 130, the selective growth process results in alternating parallel strips of field oxide 300 and exposed regions corresponding to the columns of cells 190 in the array.

Referring to FIG. 3, field oxide regions 300 are conventionally formed by, for example: growing a layer of thermal oxide ("barrier oxide" or "pad oxide") 110, over the surface of substrate 100. A masking layer 120, frequently composed of nitride, is deposited on barrier oxide 110, and patterned to cover those regions 370 of substrate 100 in which devices are to be formed (herein referred to as active regions 370).

Referring to FIG. 4, after patterning masking layer 120, a field oxide 300 is grown in the exposed areas of the barrier oxide 110, by for example, local oxidation of silicon (LOCOS). Field oxide 300 provides electrical isolation of the various active regions 370. After growing field oxide 300, masking layer 120 and barrier oxide 110 are stripped to expose the underlying substrate 100. During the field oxide growth phase, although the nitride of masking layer 120 prevents direct exposure of the underlying barrier oxide 110, oxygen diffuses under the edges of the nitride and partially oxidizes the underlying barrier oxide 110. Diffusion of oxygen under the nitride causes lateral encroachments of field oxide 300, commonly referred to as "birds' beaks" 350.

Birds' beaks 350 present a recurring problem in the manufacturing process by reducing the area of active regions 370, for example by length $L_{BB}$, on each side of active region 370. For applications requiring very small active regions, birds' beaks 350 complicate the manufacturing process and, indeed, can present a limiting factor to density. Birds' beaks 350 may also grow large enough to cause "punch through," in which adjacent birds' beaks 350 become large enough to meet under the nitride, effectively destroying active region 370. In addition, the different oxidation rates that form birds' beaks 350 induce stress-related problems, such as crystal dislocation defects in the substrate, that degrade performance. Furthermore, in high packing density applications, field oxide 300 may not grow fully in very narrow spaces between active regions 370, resulting in unreliable isolation of the active regions 370.

Several techniques have been proposed to eliminate birds' beaks and their drawbacks, such as trench isolation, sealed interface LOCOS (SILO), and sidewall mask isolation (SWAMI) techniques. In trench isolation processes, a trench is etched in the substrate surrounding an active region and the trench filled with an electrically insulating material. The insulating material, however, often damages the walls of the trench, which allows a leakage current to flow between the source and drain under the gate. Trenches also tend to produce stress-induced crystal defects, particularly at sharp corners created during the formation of the trench.

Sealed interface LOCOS (SILO) techniques eliminate the pad or barrier oxide; the entire surface of the substrate is thermally nitridized. A second layer of nitride is deposited on the thermal nitride, both the first and second nitride layers are patterned and etched, and the exposed portion of the substrate is oxidized to form field oxide regions. The thermal (or first) nitride layer is used to prevent lateral oxidation, i.e., formation of birds' beaks. Various aspects of SILO technology are discussed in "Physical and Electrical Characterization of a SILO Isolation Structure," Deroux-Dauphin, et al., IEEE Transactions on Electron Devices, Vol. ED-32, No. 11, p. 2392, November, 1985.

The SILO process, however, may cause stress-induced defects due to, among other things, the brittleness of the thermal nitride and the different thermal expansion characteristics of the thermal nitride and the silicon substrate. Stress-induced defects include dislocation defects and stacking faults, which decade performance.

SWAMI combines trench isolation and LOCOS techniques. A trench is initially etched in the silicon substrate and then covers the surface of the substrate and the sidewalls of the trench with a nitride layer. The nitride layer is removed from the bottom of the trench to thermally oxidize the underlying substrate exposed at the bottom of the trench, which fills the trench with oxide. Like other trench isolation methods, SWAMI frequently causes stress-induced defects due to oxidation of the substrate in an area confined by the nitride layer. Various aspects of SWAMI technology are discussed in "Electrical Properties for MOS LSI's Fabricated Using Stacked Oxide SWAMI Technology," Sawada, et al., IEEE Transactions on Electron Devices, Col. ED-32, No. 11, p. 2243, November, 1985.

In addition to the problems and limitations created by birds' beaks 350, reductions in the size of cell 190 are further limited by minimum control gate-floating gate coupling requirements. To effect a charge on floating gate 230, the voltage on control gate 240 is capacitively coupled to floating gate 230, which permits control gate 240 to control the voltage on floating gate 230. Inadequate capacitive coupling between control gate 240 and floating gate 230, however, inhibits proper operation of cell 190.

The degree of capacitive coupling is significantly affected by the overlapping surface area of gates 230 and 240. Referring again to FIG. 2, control gate 240 and floating gate 230 conventionally comprises parallel planes of conductive material (separated by interpoly dielectric 270). Increased overlapping surface area of gates 230, 240 contributes to greater capacitive coupling. If the area of either gate 230 and 240 is too small, however, the effectiveness of the coupling degrades and adversely affects the threshold voltage. Consequently, each gate 230, 240 must provide sufficient area to effectively couple control gate 240 to floating gate 230. This factor operates as an effective minimum, below which cell 190 may not operate properly. As a result, efforts to reduce the size of cells 190 in core area 130 are limited by the minimum size of gates 230 and 240.

In sum, the problems associated with birds' beaks decade the reliability of the design and manufacturing process. Although techniques have been devised to alleviate these difficulties, these techniques provide limited success and often induce other defects. As a result, the problems presented by birds' beaks remain unsolved. In addition, the requisite surface area of each control gate 240 and floating gate 230 also tend to limit reductions in the size of cell 190, presenting device packing density limitations.

SUMMARY OF THE INVENTION

A semiconductor device according to one aspect of the present invention provides high cell density without sacrificing electrical isolation by growing a layer of field oxide over the entire core and selectively etching the field oxide to expose the underlying active regions where columns of cells are to be formed. Birds' beaks are avoided; the etching process penetrates substantially vertically into the field oxide. Elimination of birds' beaks diminishes associated difficulties, including active region area loss, stresses at the edge of the field oxidation, electrical isolation failures, and field oxidation punch through, permitting higher cell density in the core area.

According to another aspect of the present invention high cell density is facilitated without sacrificing control gate-floating gate coupling, by conforming the opposing surfaces of a portion of the floating gate and control gate to the vertically walled trench in the field oxide formed by etching the field oxide such that the floating gate and control gate include cooperating transverse (e.g., vertical) surfaces. Because of the transverse (e.g., vertical) surfaces, the floating gates and the control gates overlap not only in the horizontal dimension, as is convention, but also in the vertical dimension, reducing the required horizontal area of the cell while maintaining the appropriate capacitive coupling between the gates.

BRIEF DESCRIPTION OF THE DRAWING

The preferred exemplary embodiment of the present invention is described in conjunction with the appended drawings, in which like designations denote like elements, and.

DETAILED DESCRIPTION OF PREFERRED EXEMPLARY EMBODIMENTS

Figure 2:
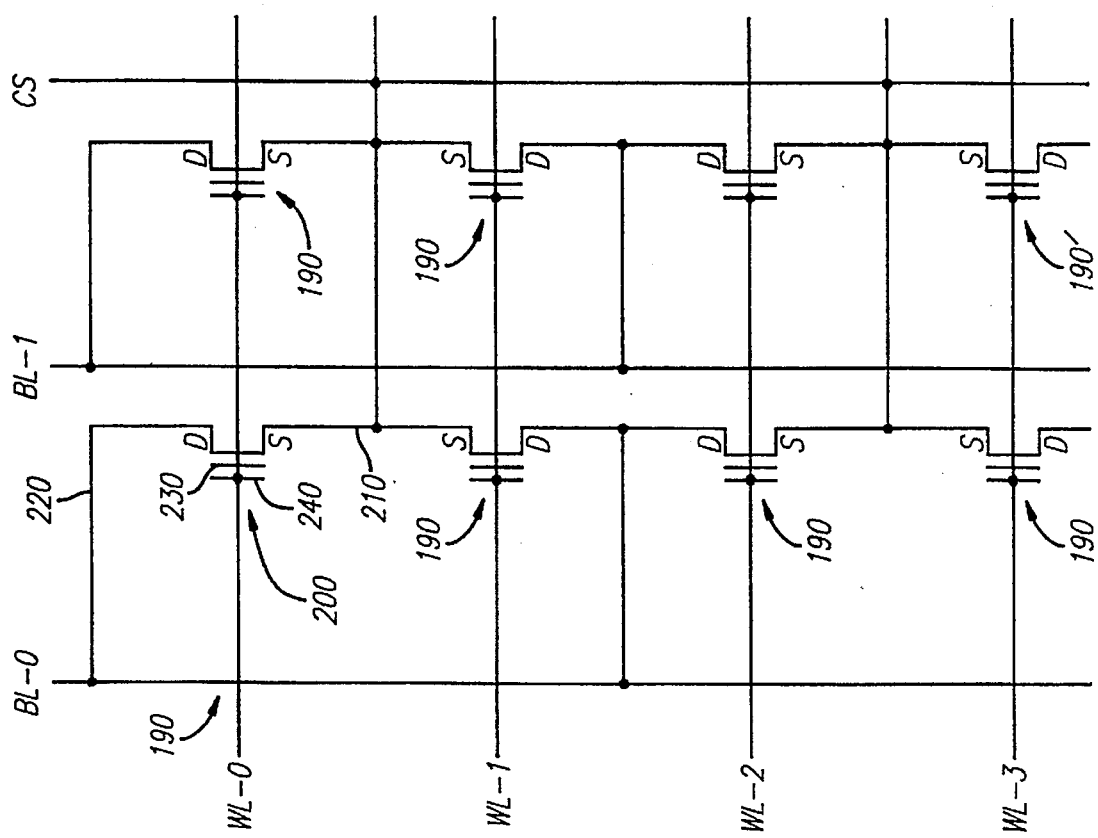
FIG. 2 is a schematic diagram of a portion of the cell array.
Figure 1:
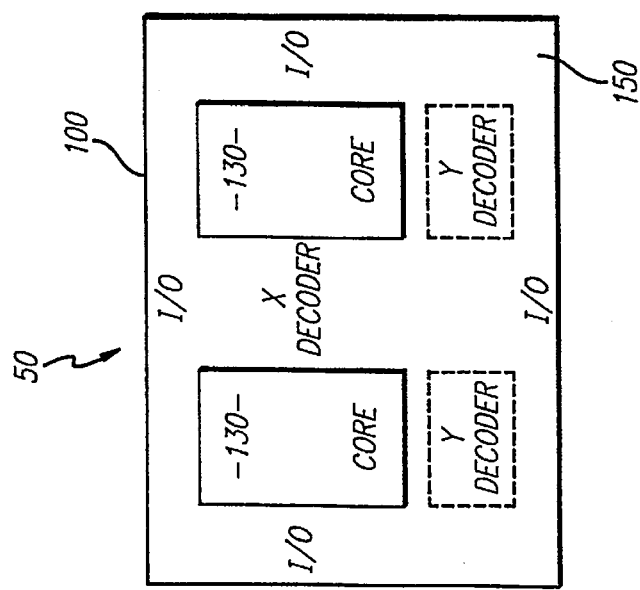
FIG. 1 is a top view of conventional memory device having an area of high density circuitry and an area of lower density circuitry.

Referring again to FIG. 2A, as previously noted, in forming an array 104 of memory cells 190, a pattern of field oxide regions 300 is initially formed on a suitable substrate 100 (e.g., silicon doped with p-type dopants, such as boron). Stacked gate-word line structures 200 (one corresponding to each row) are then formed, followed by further etching and doping in exposed regions of substrate 100 (in predetermined disposition to stacked gate structures 200) to form the source and drain regions of the respective cells 190.

In accordance with various aspects of the present invention, high cell density is provided without sacrificing electrical isolation by effectively eliminating bird's beaks 350. In contradistinction to the prior art mask and selective growth process, field oxide regions 300 are formed by depositing or growing a layer of field oxide over the entire core and selectively etching trenches, preferably substantially vertically sided, in the field oxide where columns of cells are to be formed.

Figure 5:
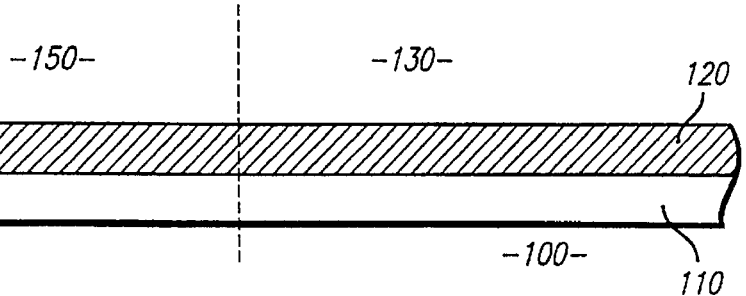
FIG. 5 is a partial, sectional view of a barrier oxide layer overlying a semiconductor substrate, and a nitride layer overlying the barrier oxide layer.
Figure 6:
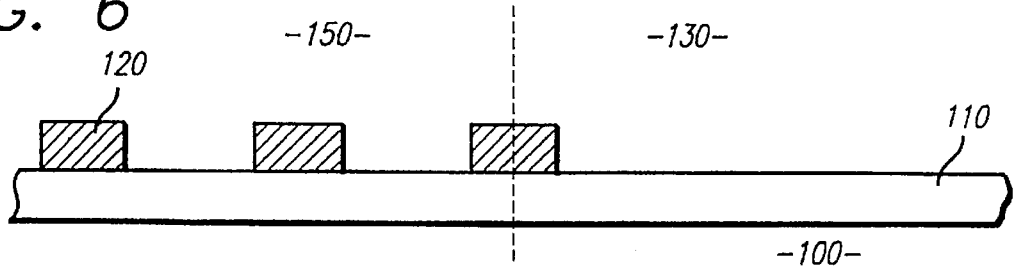
FIG. 6 is a partial, sectional view of a patterned and etched masking layer on a semiconductor substrate formed in accordance with various aspects of the present invention.
Figure 7:
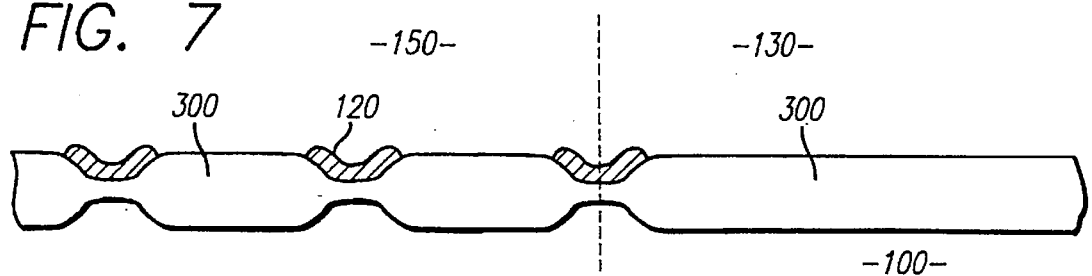
FIG. 7 is a partial, sectional view of field oxide regions formed on a substrate in accordance with various aspects of the present invention.

Referring to FIGS. 5, 6 and 7, a field oxide layer 300 is formed, by any suitable process (e.g. thermally grown or deposited), covering substantially all of core area 130. If desired, field oxide layer 300 may also be grown over the entirety of low-density peripheral portion 150 and peripheral portion 150 processed in the same manner as (and in conjunction with) core 130. However, in some instances it may be desirable to employ conventional mask and selective growth processes to establish the field oxide regions in peripheral area 150.

For example, referring to FIG. 5, a dielectric barrier layer 110 is formed on the surface of substrate 100. Barrier layer 110, suitably formed of any dielectric material which may be applied to and removed from substrate 100 (preferably without damaging substrate 100), may be established by any suitable technique. Barrier layer 110 may, for example, comprise an oxide layer, suitably formed by thermally oxidizing the surface of substrate 100. Alternatively, barrier layer 110 may be formed by depositing a suitable barrier material on substrate 100.

If conventional mask and selection growth processing are to be employed in peripheral area 150, a masking layer 120 is formed overlying barrier layer 110. Masking layer 120 may be formed, by any suitable technique, of any suitable non-oxidizing material which tends to shield underlying areas from oxidation, and which may be applied and selectively removed to establish a predetermined pattern. For example, masking layer 120 may comprise nitride deposited using conventional chemical vapor deposition (CVD).

Referring to FIG. 6, masking layer 120 is patterned and portions selectively removed, by any suitable technique, to expose predetermined areas of barrier layer 110 and establish a predetermined pattern. For example, masking layer 120 may be patterned and etched using a conventional active region (e.g. source/drain) mask. The mask pattern suitably shields those areas of low density peripheral portion 150 where devices are to be formed, but, in contrast to conventional processes, the pattern leaves core 130 substantially exposed. If peripheral portion 150 is to be processed in the same manner as (and in conjunction with) core 130, mask 120 would be omitted altogether and field oxide layer 300 grown over the entirety of low-density peripheral portion 150 as well as core 130.

Referring now to FIG. 7, field oxide 300 is formed, by any suitable process, on exposed portions of barrier layer 110 in periphery 150 and core 130. For example, thermal oxide may be grown by exposing barrier layer 110 to a mixture of dry oxygen or water vapor, and hydrochloric acid gases at elevated temperatures. Because core 130 is substantially completely exposed, field oxide 300 is formed over substantially the entire core 130. Field oxide 300 is suitably grown to a selected thickness, for example 1100 to 8000 Å.

Masking layer 120, if employed, is then suitably removed. Removal can be effected by any suitable technique, such as, for example, by a conventional hot phosphoric wet etch. If desired, before removing masking layer 120, the device can be planarized. For example, a plasma etch or a wet etch may be employed to remove portions of field oxide 300 and masking layer 120, e.g., approximately 500–1,500 Å. Such an etching step tends to ensure a uniform height of field oxide 300. After removing masking layer 120, residual masking layer material 120 is suitably removed. For example, one or more layers of sacrificial oxide may be grown to remove any residue of masking layer 120 remaining on the surface.

A core implant mask layer is applied and patterned to cover peripheral area 150, but expose core area 130. A p-type dopant is then suitably implanted in core area 130 to adjust the doping concentration in core 130 to control the threshold voltage and punch through of memory cells 190.

Figure 8:
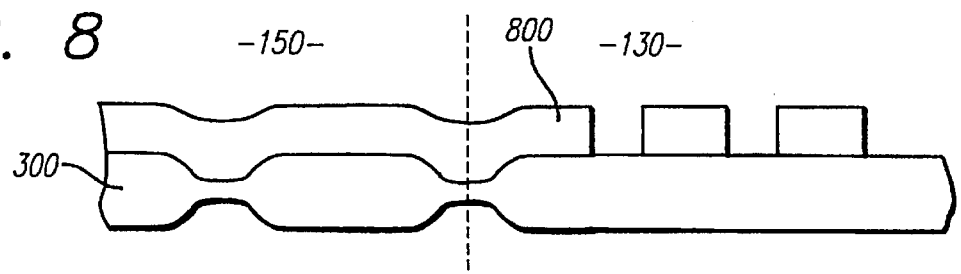
FIG. 8 is a partial, sectional view of a patterned substrate in accordance with various aspects of the present invention.

At this point, a continuous layer of field oxide covers substantially the entire core 130. Those portions of field oxide 300 overlying the areas within core 130 where columns of cells 190 are to be formed are then selectively removed to expose the underlying substrate 100. Referring to FIG. 8, a photoresist mask layer 800 is used to define the situs of the trenches. Mask layer 800 may be formed, by any suitable technique, over field oxide layer 300, and suitably the entirety of periphery 150. Mask 800 is patterned to expose those portions of field oxide 300 overlying the active regions in core 130, i.e., where the source, channel, and drain regions of cells in the respective columns of array 104 are to be formed.

Figure 8A:
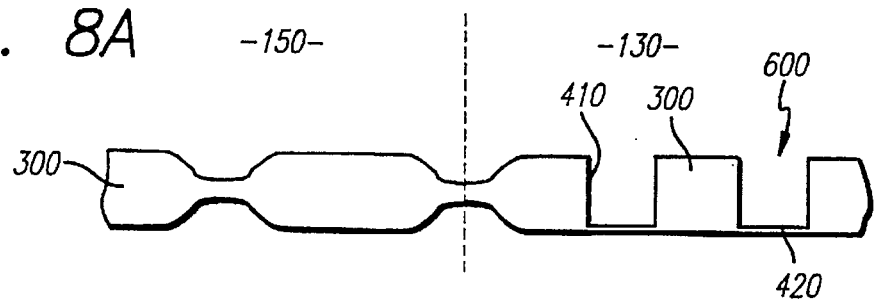
FIG. 8A is a partial, sectional view of etched field oxide in a core area of a substrate in accordance with various aspects of the present invention.

Referring to FIG. 8A, unmasked portions of field oxide 300 overlying the active regions of core 130 are then selectively removed, e.g., etched away to expose the underlying substrate 100. Field oxide 300 may be etched by any suitable method, such as a high selectivity oxide etch. Etching field oxide from over the active regions suitably produces cavities (trenches) 600 in the field oxide having transverse (preferably substantially vertical) walls 410. Mask 800 over core 130 and periphery 150 may then be removed in any suitable manner.

The etching process results in alternating parallel strips of exposed substrate (trenches 600, corresponding to the columns of cells 190 in array 104) and field oxide 300 to provide electrical isolation of the various columns of cells. Such alternating strip configuration is generally similar to that produced by conventional selective oxide growth processes. However, the selective removal, e.g., etching of field oxide 300 overlying the active regions, produces trenches (wells) with substantially straight, transverse (typically substantially vertical) walls 410 and thus avoids the lateral encroachment of field oxide layer 300 into the active regions which tends to occur with conventional LOCOS isolation processes. Selective removal of field oxide 300 thus eliminates the need to compensate for the reduction of active regions due to birds' beaks and facilitates fabrication of higher density devices. Etching field oxide 300 in accordance with this invention further eliminates oxide thinning effects and nitride liftoff/punch through problems associated with conventional LOCOS methods. Oxide thinning effects are no longer present because field oxide 300 is first grown over the entire core 130; the spacing of the active regions does not inhibit growing field oxide 300 to full thickness. Nitride is no longer necessary to mask active regions of core area 130 prior to growing field oxide 300, eliminating punch through and nitride lift off.

Figure 2A:
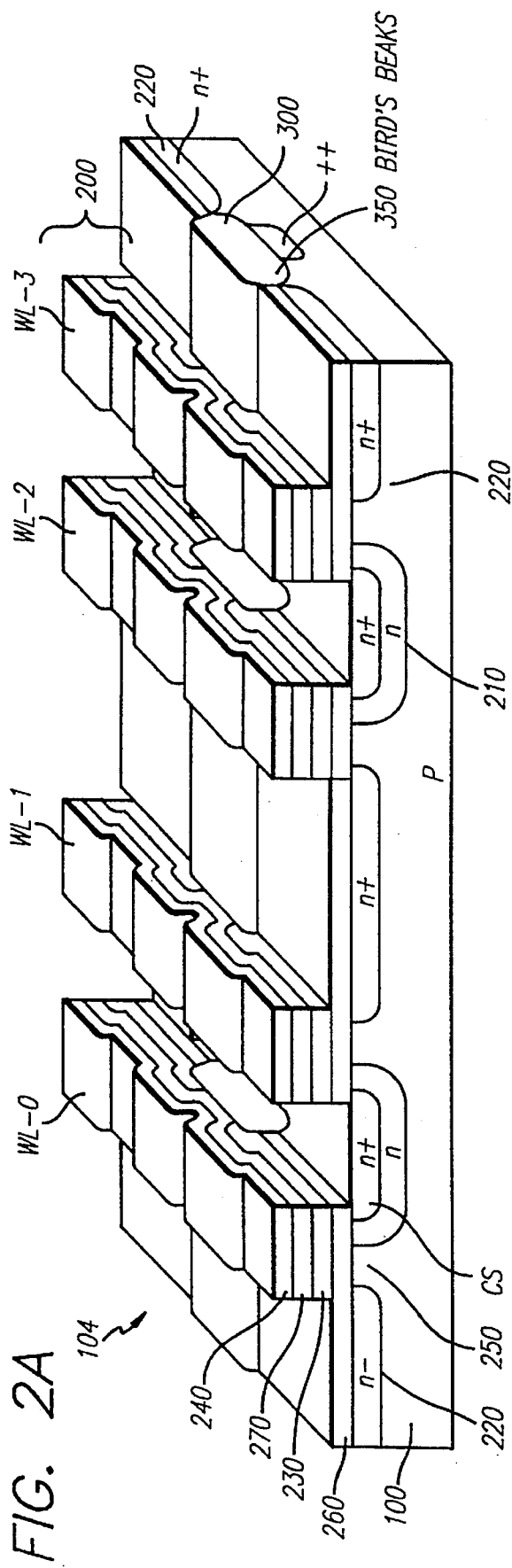
FIG. 2A is a partial, sectional perspective of a portion of an intermediate state (partially complete) of a cell array core 130.
Figure 3:
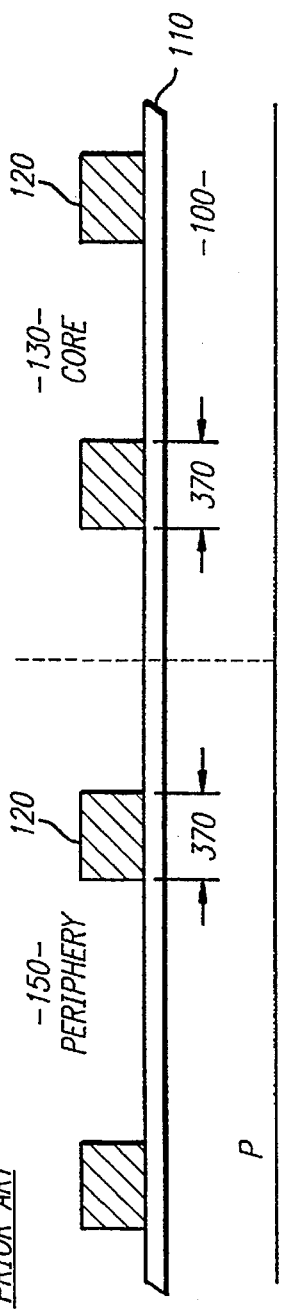
FIG. 3 is a partial, sectional view of a substrate having a conventionally patterned state (partially complete) of a cell array core 130 and etched masking layer.
Figure 4:
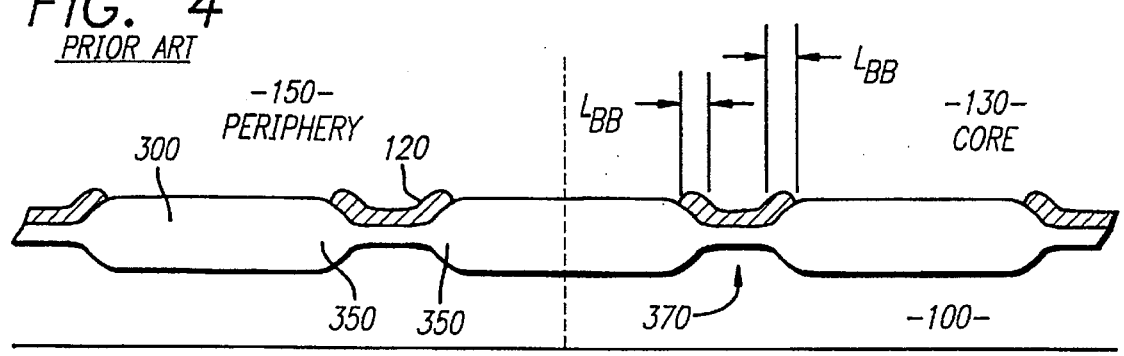
FIG. 4 is a partial, sectional view of the substrate of FIG. 3 having field oxide regions formed by a conventional LOCOS process.

Respective stacked gate-word line structures 200, one corresponding to cells 190 in each row of array 104, are then formed. Referring again to FIG. 8A, a thin oxide layer 420 (e.g., approximately 50 to 100 angstroms) is suitably grown over the active regions of periphery 150 and core 130 (e.g., the bottoms of trenches 600). Oxide 420 may be formed according to any suitable technique, such as thermal oxidation. For products like flash EEPROMs, this thin oxide layer may be employed as the tunnel oxide through which electrons pass to charge and discharge floating gate 230 (FIG. 2). Similarly, in an EEPROM, this thin oxide layer may be employed as the gate oxide.

Figure 9:
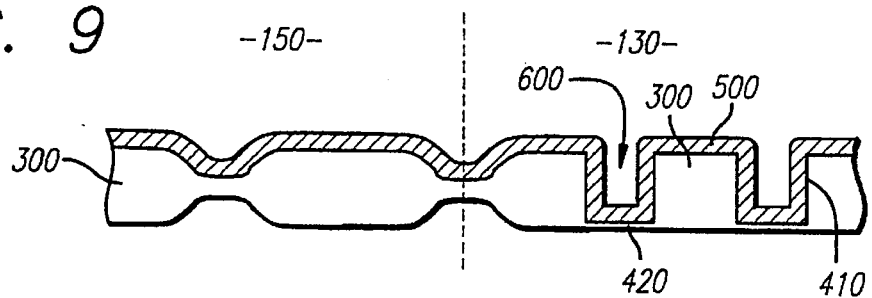
FIG. 9 is a partial, sectional view of a polysilicon layer overlying field oxide regions formed in accordance with various aspects of the present invention.

Referring to FIG. 9, a suitable polysilicon layer 500 is then formed over the surface of core 130 and periphery 150. Polysilicon layer 500 suitably comprises conventional doped polycrystalline silicon, or an in-sire doped amorphous silicon, and may be deposited in any suitable manner which forms a layer of polysilicon on the bottom and both walls 410 of trench 600, generally conforming to the contours of trench 600. For example, polysilicon layer 500 may be deposited using conventional CVD techniques.

Figure 10A:
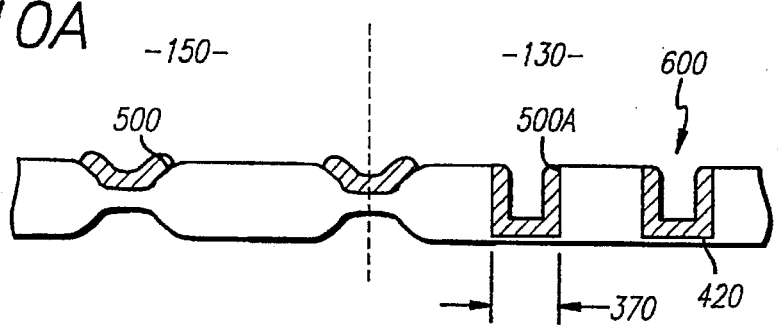
FIG. 10A is a partial, sectional view of floating gates in a semiconductor substrate formed by polishing away polysilicon in accordance with various aspects of the present invention.
Figure 10B:
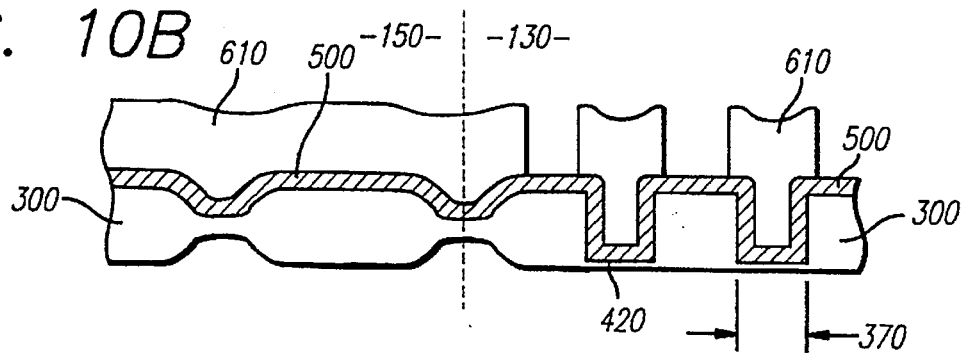
FIG. 10B is a partial, sectional view of a patterned photoresist layer overlying a polysilicon layer formed in accordance with an alternate embodiment of the present invention.
Figure 10C:
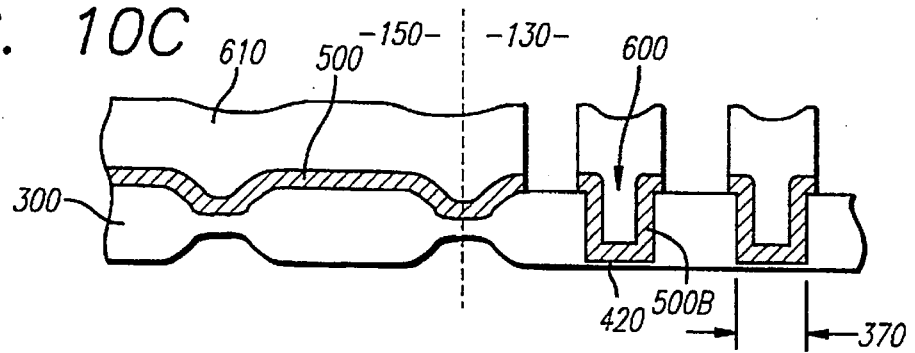
FIG. 10C is a partial, sectional view of a patterned photoresist layer overlying a polysilicon layer etched to form floating gates in accordance with an alternate embodiment of the present invention.
Figure 10D:
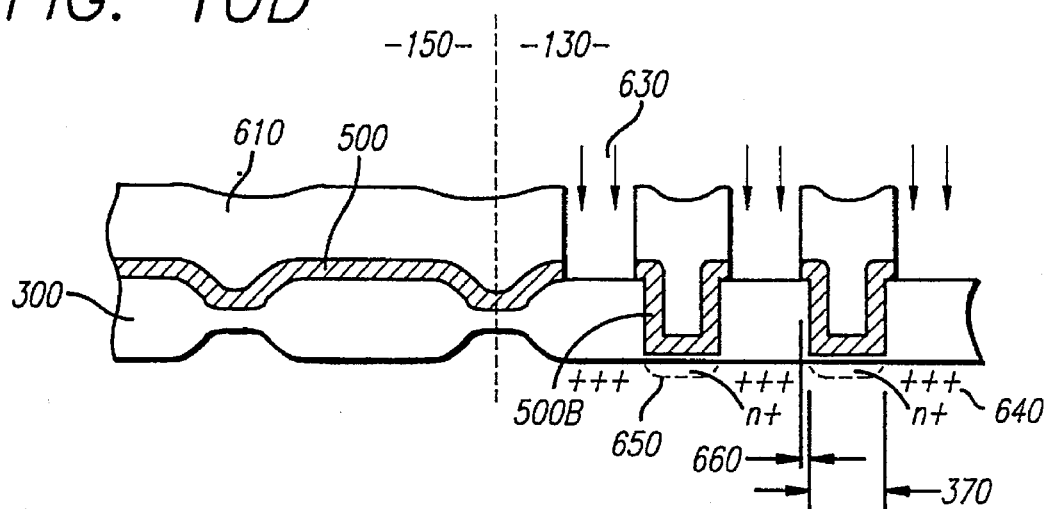
FIG. 10D is a partial, sectional view of a channel stop implant performed on field oxide regions in accordance with an alternate embodiment of the present invention.

Polysilicon layer 500 is suitably then selectively removed to form intermediates for floating gates; the portions of polysilicon layer 500 overlying field oxide regions 300 are substantially removed. Referring to FIGS. 10A through 10D, portions of polysilicon layer 500 may be removed using any suitable method, for example by a polishing process (FIG. 10A) or an etching process (FIGS. 10B through 10D). Referring to FIG. 10A, for example, the portions of polysilicon layer 500 that overlie high points on the wafer are polished away using, for example, a chemical and mechanical polishing process, so that the polysilicon 500 is left only inside trenches 600 of core 130, forming respective generally U-shaped cross-section polysilicon strips 500A (from which the floating gates of the individual cells will be formed). Forming floating gates 500A in accordance with this aspect of the invention results in no lateral extension of polysilicon 500 onto field oxide 300, and thus, allows for closer spacing between active regions and higher cell 190 packing density.

Alternatively, extraneous portions of polysilicon layer 500 overlying field oxide regions 300 outside of trenches 600 can be substantially removed by a mask and etch process. Referring to FIGS. 10B through 10D, a conventional photoresist 610 may be deposited over polysilicon layer 500 (FIG. 10B) and selectively removed to expose areas of polysilicon layer 500 overlying field oxide regions 300 (FIG. 10C). Exposed areas of polysilicon layer 500 are then etched to form generally U-shaped cross-section polysilicon strips 500B (from which the floating gates of the individual cells will be formed) in trenches 600 (FIG. 10D).

Electrical isolation of components in core 130 may be enhanced to further isolate components in core 130. For example, electrical isolation within core 130 may be enhanced by implanting dopant ions where field oxide 300 is to be formed prior to (or after) forming field oxide 300 in core 130. Alternatively, when floating gates 500B are formed by etching (FIGS. 10B through 10D), a channel stop implant 630 may be performed after etching polysilicon layer 500 to increase field doping under field oxide 300. Referring to FIG. 10D, channel stop implant 630 suitably introduces p-type dopant ions 640, such as boron, into the areas underlying field oxide 300 in core 130, thus improving the electrical isolation between components in core 130. Channel stop implant 630 suitably is between active regions 370, but offset by a distance 660 from bit lines n+ junction 650 (formed later in the process) by photo resist 610. Offset distance 660 permits increase of the field threshold voltage without reducing the junction breakdown voltage of the n+ bit line.

A separate mask may be used to implant the dopant ions under field oxide 300 without penetrating active region 370. To ensure proper alignment of the mask with floating gates, however, channel stop 630 implant may be performed with the mask formed by photoresist 610 overlying polysilicon layer 500 used to form floating gates 500B (FIG. 10D). Photoresist 610 suitably forms a dark field mask which masks periphery 150, preventing channel stop implantation 630 in periphery 150. By using the same mask, channel stop implant 630 is self-aligned with floating gate 500B, thus eliminating mask alignment difficulties.

Figure 11A:
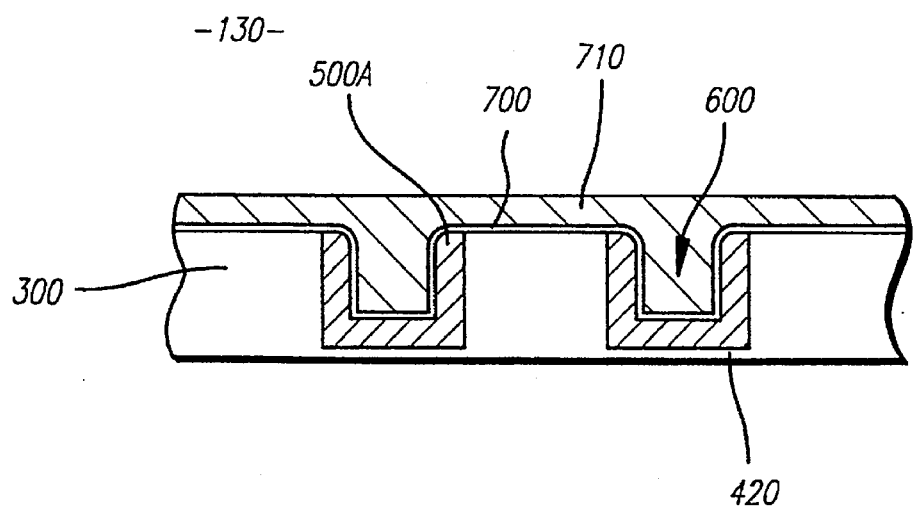
FIG. 11A is a partial, sectional view of a nonvolatile memory cell formed in accordance with various aspects of the present invention.
Figure 11B:
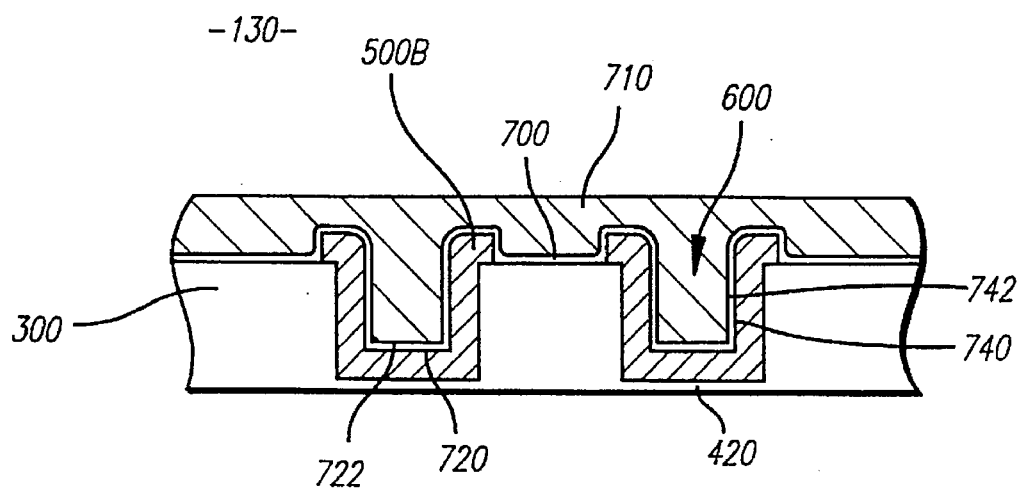
FIG. 11B is a partial, sectional view of a nonvolatile memory cell formed in accordance with an alternate embodiment of the present invention.

Referring to FIGS. 11A and 11B, after formation of polysilicon strips 500A (500B), a layer 700 of suitable dielectric material such as, e.g. , an oxide-nitrite-oxide (ONO) layer, (that will ultimately form interpoly dielectric layers of individual cells 190) is typically then formed, by any suitable process, over core 130. For example, where interpoly dielectric 700 is ONO, it is suitably formed by growing a layer of oxide, depositing a layer of nitrite, followed by growing another layer of oxide. Interpoly dielectric 700 layer, in the completed array, insulates control gates from floating gates 500A (500B) in the individual cells.

Another layer 710 of suitable conductive polysilicon (e.g., polycrystalline silicon), (from which control gates of cells 190 and word lines WL connecting the control gates of the cells in the respective rows of array 104 will ultimately be formed) is typically then deposited on interpoly dielectric layer 700, by any suitable technique, such as, for example, by conventional chemical vapor deposition (CVD). As shown in FIGS. 11A and 11B, deposition of polysilicon 710 suitably extends into, and preferably substantially fills, trenches 600 of floating gates 500A (500B). Control gates 710, formed from polysilicon layer 710, thus include both lateral (e.g., horizontal) surfaces 722 and transverse (e.g., vertical) surfaces 742 opposing (through intervening interpoly dielectric 710) corresponding lateral (e.g., horizontal) surfaces 720 and transverse (e.g., vertical) surfaces 740 of floating gate strip 500A (500B). The opposing transverse (e.g., vertical) surfaces 740, 742 increases capacitive coupling of the control gate to the floating gate, allowing for reduced horizontal spacing of the floating gate. No significant additional vertical real estate is required; the additional gate area corresponds to the depth of field oxide regions 300. Thus, the active regions may be spaced closer to each other resulting in a higher density device. Transverse walls 740 and 742, may be at various angles with respect to lateral walls 720, 722. However, it is preferred that the transverse walls approach the vertical (90 degrees) to maximize gate surface area for a given lateral (e.g., horizontal) dimension. A silicide layer (not shown) may be provided over the second polysilicon layer to reduce resistance.

Array 104 and EEPROM 50 are then completed by any suitable process. Portions of the respective polysilicon and interpoly dielectric layers are typically then selectively removed, to define stacked gate structures 200 on tunnel dielectric layer 420, connecting the individual cells of the respective rows of array. This is typically effected by suitable masking and etching techniques. Further etching and doping in exposed regions of substrate 100 (in predetermined disposition to stacked gate structures 200) is then typically performed to form the source and drain regions of the respective cells 190, and various interconnections within and to array 104 effected. Polysilicon layer 500 is suitably etched from periphery 150. After etching polysilicon layer 500, conventional techniques are thereafter suitably employed to form periphery transistors, passivation layers, and conductive interconnect layers (formed of, for example, polysilicon or metal). Conventional techniques are used to complete fabrication of the semiconductor memory device.

Thus, a memory device according to various aspects of the present invention provides higher cell density in the core. Selectively removing portions of (e.g., etching) a solid field of field oxide to expose active regions eliminates the formation of birds' beaks in the core. Since none of the active region is lost to birds' beaks, higher cell density in the core is facilitated. In addition, cell density is further enhanced by providing for transverse (e.g., vertical) overlap of the control gate and floating gate. By using vertical overlap as well as horizontal overlap, the requisite capacitive coupling between the control gate and floating gate is maintained, yet the horizontal dimensions of the cell decrease. Therefore, the overall size of the device is reduced.

The foregoing describes preferred embodiments of the present invention known to the applicants at the time of filing. Such embodiments, however, are merely exemplary. The invention is not limited to the specific forms described. Modifications to the embodiments described above are contemplated, may be made within the scope of the invention, as defined by the claims.

We claim:

1. A method for forming a high density array of floating gate memory cells in a semiconductor substrate, where the array includes respective insulative material regions disposed between groups of cells, and each cell comprises source, channel and drain semiconductor regions in the substrate, and a first dielectric, a floating gate, a second dielectric and a control gate, formed overlying the channel, the source and drain regions defining a controlled current path through the channel which tends to be rendered conductive in response to a voltage above a gate threshold level being applied to the control gate; the method comprising the steps of:

forming on a surface of the substrate, a layer of insulative material;

selecting portions of the insulative material in which wells are to be subsequently formed;

removing the selected portions of the insulative material, leaving remaining portions thereof, to form respective wells in the insulative material, each well having transverse sides and a bottom, the bottom corresponding to areas of the substrate surface at which an associated group of cells is to be formed;

forming a first dielectric layer on the bottoms of the wells;

forming a first layer of conductive material on the bottom of the wells overlying the first dielectric, the transverse sides of the wells and the remaining portions of the insulative material;

removing portions of the first layer of conductive material overlying only the remaining portions of the insulative material;

forming a second dielectric layer overlying the first layer of conductive material on the bottom and transverse sides of the wells; and forming a second layer of conductive material on the second dielectric and extending into the wells overlying the first layer of conductive material.

2. The method of claim 1 wherein the first layer of conductive material is polysilicon.

3. The method of claim 2, wherein the step of removing portions of the polysilicon layer overlying only the remaining portions of the insulative material comprises polishing away only portions of the polysilicon layer disposed outside of the well.

4. The method of claim 2, wherein the step of removing portions of the polysilicon layer disposed outside of the well comprises:

depositing a mask over the polysilicon layer and selectively removing portions of the mask to expose only areas of the polysilicon layer overlying the insulative material; and etching away the exposed areas of the polysilicon layer.

5. The method of claim 4, further including the step of effecting a channel stop implant into the areas from which the exposed areas of the polysilicon layer were etched away.

6. The method of claim 5, further including the step of effecting a channel stop implant performed with the mask still in place.

7. The method of claim 5, further including the step of effecting a channel stop implant self aligned to the edge of the polysilicon layer.

8. The method of claim 5 wherein the channel stop implant step introduces p-type dopant ions into the substrate underlying the insulative material between the wells.

9. The method of claim 5 wherein the channel stop implant step introduces boron ions into the substrate underlying the insulative material between the wells.

10. The method of claim 1 wherein the insulative material is field oxide.

11. The method of claim 1 wherein the step of forming a layer of insulative material comprises growing a layer of field oxide on the surface of the substrate.

12. The method of claim 11 wherein the layer of insulative material is grown to a thickness, in the range of 1100 Å to 8000 Å.

13. The method of claim 11 wherein the step of growing a layer of field oxide on the surface of the substrate comprises the steps of exposing the substrate surface to a mixture of dry oxygen and hydrochloric acid gases at elevated temperatures.

14. The method of claim 11 wherein the step of growing a layer of field oxide on the surface of the substrate comprises the steps of exposing the substrate surface to a mixture of water vapor and hydrochloric acid gases at elevated temperatures.

15. The method of claim 11 wherein the step of growing a layer of field oxide on the surface of the substrate comprises the steps of exposing the substrate surface to water vapor and at elevated temperatures.

16. The method of claim 1 wherein the step of forming a layer of insulative material comprises depositing a layer of field oxide on the surface of the substrate.

17. The method of claim 1 wherein the desired thickness of the layer is selected and the insulative material is grown to the selected thickness.

18. The method of claim 1 wherein the layer of insulative material is grown to a selected thickness in the range of 1100 Å to 8000 Å.

19. The method of claim 1 wherein the step of selectively removing the selected portions of the insulative material forms respective wells in the insulative material such that each well has substantially straight transverse sides and a bottom, with the sides at an angle of substantially 90 degrees relative to the bottom.

20. The method of claim 1 further including the step of implanting dopant ions under the remaining portions of the insulative material.

21. An array of memory cells formed by the method of claim 1.

22. An EEPROM including an array of memory cells formed by the method of claim 1.

23. The method of claim 20, wherein the dopant ions are boron ions.

* * * * *

UNITED STATES PATENT AND TRADEMARK OFFICE
CERTIFICATE OF CORRECTION

PATENT NO. : 5,661,055
DATED : August 26, 1997
INVENTOR(S) : James Juen Hsu, et al.

It is certified that error appears in the above-identified patent and that said Letters Patent is hereby corrected as shown below:

Column 3, line 13, "trench filled" should read --trench is filled--.
Column 3, line 18, "comers" should read -- corners--.
Column 4, line 9, "decade" should read --degrade--.
Column 7, line 59, "in-sire" should read --in-situ--.

Signed and Sealed this

Twenty-fifth Day of November, 1997

*Attest:*

BRUCE LEHMAN

*Attesting Officer*  *Commissioner of Patents and Trademarks*